(12) United States Patent
Cook et al.

(10) Patent No.: US 6,332,659 B1
(45) Date of Patent: Dec. 25, 2001

(54) MODULAR CABINET FOR HOUSING ELECTRONICS

(75) Inventors: Charles William Cook, Palo Alto, CA (US); Dermot Hopkins, Dublin (IE); Jason Abraham Kay, Ramsey; David Steven Kerr, Mendham, both of NJ (US); Ivan Pawlenko, Holland, PA (US); Dieter N. Scherer, Palo Alto, CA (US); Michael Jay Wheeler, Haverhill, MA (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/443,383

(22) Filed: Nov. 19, 1999

(51) Int. Cl.[7] .................................................. A47B 47/00
(52) U.S. Cl. ........................ 312/263; 312/257.1; 312/275; 220/617

(58) Field of Search .................................. 312/257.1, 263, 312/401, 265.5, 275; 220/614, 615, 617, 619, 670

(56) References Cited

U.S. PATENT DOCUMENTS

| 758,331 | * | 4/1904 | Ohnstrand | 312/257.1 X |
|---|---|---|---|---|
| 3,698,596 | * | 10/1972 | Potts | 222/617 X |
| 4,331,244 | * | 5/1982 | Davis, Jr. | 312/257.1 X |
| 5,497,895 | * | 3/1996 | Rudbach | 220/670 X |

* cited by examiner

Primary Examiner—Peter M. Cuomo
Assistant Examiner—Michael J. Fisher

(57) ABSTRACT

A modular cabinet includes a plurality of modular wall panels that interlock with one another via tubular connector assemblies. Each tubular connector assembly has a female tubular member attached to a modular panel and a male tubular member attached to an adjacent modular wall panel. The tubular connector assembly joins the modular panel and the adjacent modular panel to form a corner of the modular cabinet.

20 Claims, 5 Drawing Sheets

MODULAR CABINET FOR HOUSING ELECTRONICS

FIELD OF THE INVENTION

This invention relates to a modular cabinet for housing electronics.

BACKGROUND OF THE INVENTION

As wireless and other telecommunication systems expand both in the United States and abroad, manufactures have deployed various cabinets for housing electronics equipment. The cabinets may be placed onto rooftops near the antennas of a wireless site; the cabinets may be placed onto concrete foundations to serve as a cellular site or otherwise. The cabinets have been designed to provide a barrier from environmental conditions to protect sensitive electronic equipment from environmental damage. Further, the cabinets may feature climate control to keep the operating temperature and humidity of the electronics equipment within an optimum or preferential environmental operating range.

However, such cabinets are often bulky and may be rather expensive to ship because of their weight and difficulty of handling. Because cabinets are often installed on roofs, in basements or other areas with limited accessibility, large cabinets may not fit through door openings or workers may be unable to maneuver cabinets to their intended site because of the excessive weight and the bulk of the cabinet. Thus, a need exists for a modular cabinet that can be assembled in the field with simple installation steps. Further, a need exists for a cabinet that can be shipped as modular component parts to save on shipping costs by limiting the weight or the size of crating or other shipping containers.

SUMMARY OF THE INVENTION

A modular cabinet includes a plurality of modular wall panels that interlock with one another via tubular connector assemblies. Each tubular connector assembly has a female tubular member attached to a modular panel and a male tubular member attached to an adjacent modular wall panel. The tubular connector assembly joins the modular panel and the adjacent modular panel to form a corner of the modular cabinet. Accordingly, the modular cabinet may be readily assembled in the field with panel components that are primarily planar and readily movable to site locations with limited or difficult accessibility.

DETAILED DESCRIPTION OF THE PREFERRED EMBODIMENTS

Figure 1:
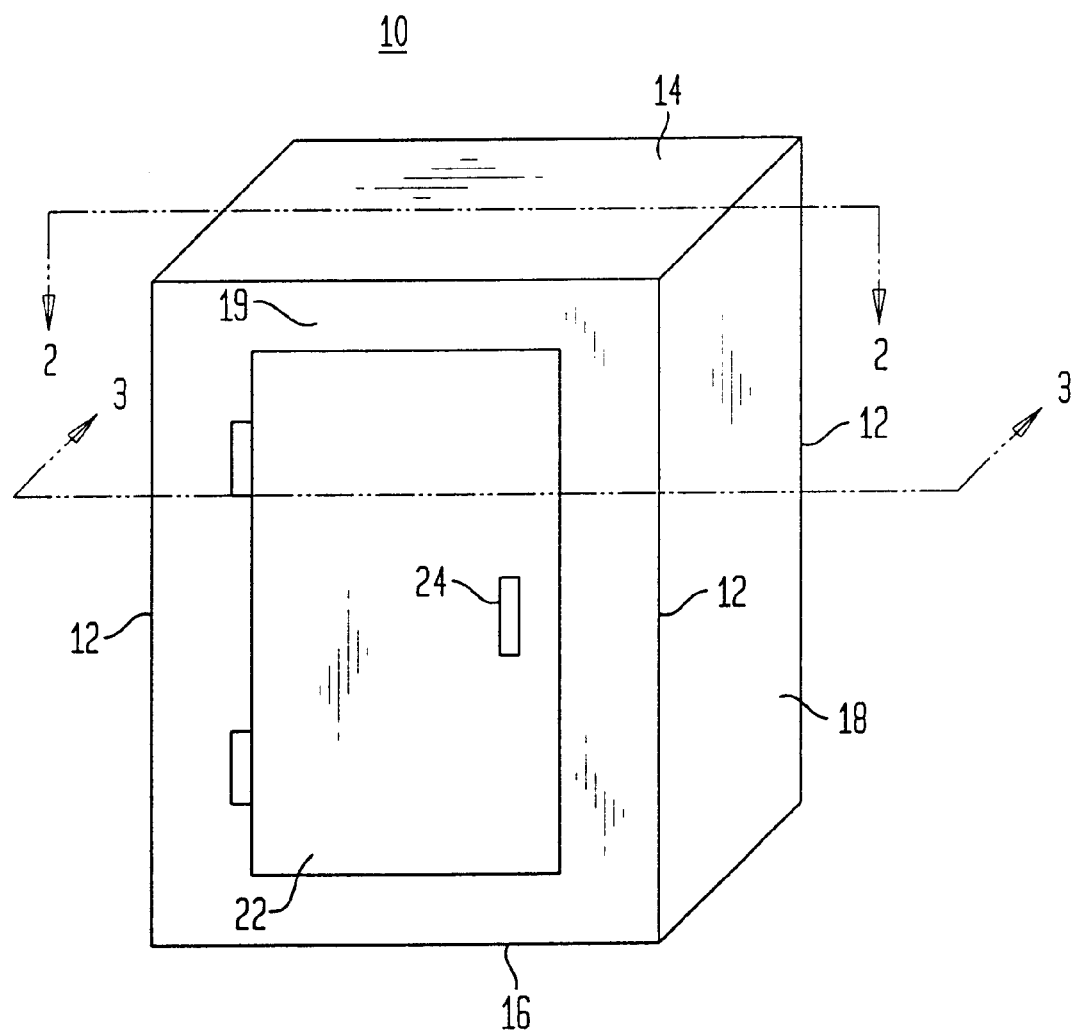
FIG. 1 is a perspective view of a modular cabinet in accordance with the invention.

In accordance with the invention as shown in FIG. 1, a modular cabinet 10 includes a plurality of modular wall panels 18 that interlock with each other to form corners 12 of the modular cabinet 10. A top panel 14 and a bottom panel 16 are fastened to the wall panels 18 to provide a modular cabinet 10 for housing electronics equipment indoors or outdoors.

The modular cabinet 10 preferably includes a door 22 hinged to one of the modular wall panels 18 to provide access to the electronics equipment. The door 22 preferably includes a handle 24 for opening and closing the door 22. A latch and a lock are preferably associated with the door 22 to protect the electronics equipment from unwanted intrusion or unauthorized access into an interior 19 of the modular cabinet 10.

Figure 2:
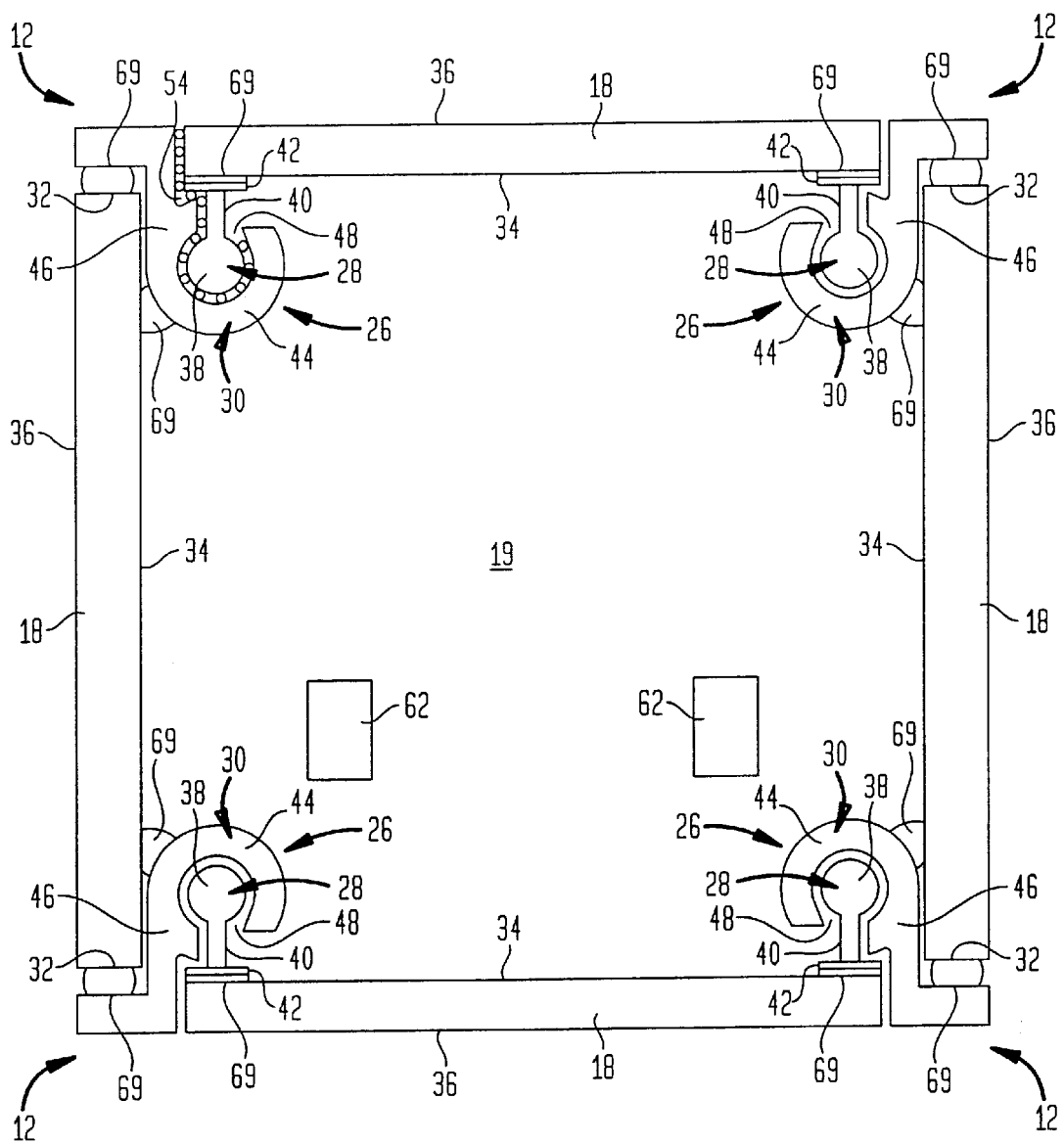
FIG. 2 is a top plan view of a modular cabinet without its top panel as viewed along reference line 2—2 of FIG. 1.

FIG. 2 illustrates connections between the modular wall panels 18 at the corners 12 of the modular cabinet 10. Four modular wall panels 18 are united with interlocking joints 26 formed by four female tubular members 30 associated with four corresponding male tubular members 28. Each modular wall panel 18 includes a tubular mating portion along two opposite edges 32. The modular wall panels 18 are arranged so that the tubular mating portions (28, 30) of adjacent modular wall panels 18 have opposite sexes to permit the joining of the four modular wall panels 18. The tubular mating portions (28, 30) are preferably located in an interior of the assembled modular cabinet 10.

In one illustrative embodiment shown in FIG. 2, the modular wall panels 18 of opposite walls have two tubular mating portions of the same sex. For example, a first set of opposite modular wall panels 18 has male tubular members 28 protruding from interior surfaces 34 of the modular wall panels 18 near their edges 32. A second set of opposite modular wall panels 18 has female tubular members 30 protruding from interior surfaces 34 of the modular wall panels 18 near their edges 32. Accordingly, the female tubular member 30 and the male tubular member 28 are arranged to allow an entire modular wall panel 18 to be installed by applying as little as a single movement or application of unidirectional force sufficient to interlock the moved modular wall panel 18 with two adjoining, relatively static, modular wall panels 18.

The male tubular member 28 includes a generally cylindrical portion 38 that preferably extends longitudinally along a height of the modular cabinet 10. The generally cylindrical portion 38 of the male tubular member 28 has a support that includes a stem 40 terminating in a base 42. The base 42 provides a mounting surface for attaching the male tubular member 28 to a corresponding modular wall panel 18. The stem 40 provides a stand-off from the modular wall panel 18 that raises the tubular portion away from the surface of the modular wall panel 18.

The female tubular member 30 includes generally a hollow cylindrical portion 44 with a longitudinal gap 48. The female tubular member further includes a mounting structure 46 for supporting the hollow cylindrical portion 44. The mounting structure 46 provides one or more surfaces that are receptive to attachment to a modular wall panel 18 by adhesive, bonding agent, welding, mechanical fastening, or otherwise.

The longitudinal gap 48 extends longitudinally along the generally cylindrical female tubular member 30. The longitudinal gap 48 is preferably located at approximately a 90 degree angle with respect to an interior surface of the modular panel with a male tubular member 28 for mating with the female tubular member 30. That is, the longitudinal gap 48 is preferably coextensive with a normal axis extending from a modular wall panel 18 with a male tubular member 28 mating with the female tubular member 30. The male tubular member 28 must be able to pass through a smaller dimension of a longitudinal gap 48 of the female tubular member 30. When the male tubular member 28 is inserted into the longitudinal gap 48 during assembly, the female tubular member 30 elastically yields preferably without permanent deformation to allow disassembly and reassembly of the modular cabinet 10 assembly. Accordingly, the modular cabinet 10 is readily collapsible into its constituent modular wall panels 18 to facilitate shipping, moving, and subsequent reassembling of the modular cabinet 10.

The male tubular member 28 has an outer diameter 50 that corresponds to an inner diameter 52 of the female portion in size and shape. An inner diameter 52 and an outer diameter 50 may be approximately equal or may include a slight clearance dimension for a radial gap between them.

The female tubular member 30 and the male tubular member 28 of the interlocking joint form an environmental seal due to the geometric shape and tolerances. Further, if a radial clearance dimension is provided between the inner diameter 52 and the outer diameter 50, the circuitous path 54 formed between the female tubular member 30 and male tubular member 28 and the modular wall panels 18 may readily be filled with an elastomeric sealant, such as silicone, to further provide weather resistance and environmental isolation.

The male tubular member 28 and female tubular member 30 may be molded if the cabinet 10 is made out of a polymeric material, a plastic material, a polymer composite, a plastic composite, or the like. In some cases, the modular wall panels 18 may be composed of a metallic material such as aluminum, stainless steel or a corrosion-resistant alloy. Even if the modular wall panels are of metallic construction, the female tubular member 30 and the male tubular member 28 may be constructed of a polymeric material, plastic material, polymer composite or a plastic composite which is adhesively bonded to the modular wall panels 18 via adhesive 69.

Although the male tubular member 28 and female tubular member 30 are preferably constructed of a polymeric or plastic material which offers the ability for a snap-fit connection because of the yield profile associated with many plastic and polymeric compounds, the female tubular member 30 and the male tubular member 28 may be constructed a ductile metal or alloy. Thus, in another configuration, the female tubular member 30 and male tubular member 28 may be composed of metal or an alloy attached to the modular wall panel 18 by welding, fasteners, or otherwise.

FIG. 2 shows a top view of an interior 19 of the modular cabinet 10. The interior 19 contains mounting rails 62 or another mounting provision for mounting electronics equipment within the interior 19 of modular cabinet 10. The interlocking tubular members (28, 30) protect the electronics equipment from the exterior environment outside of the modular cabinet 10.

Figure 3:
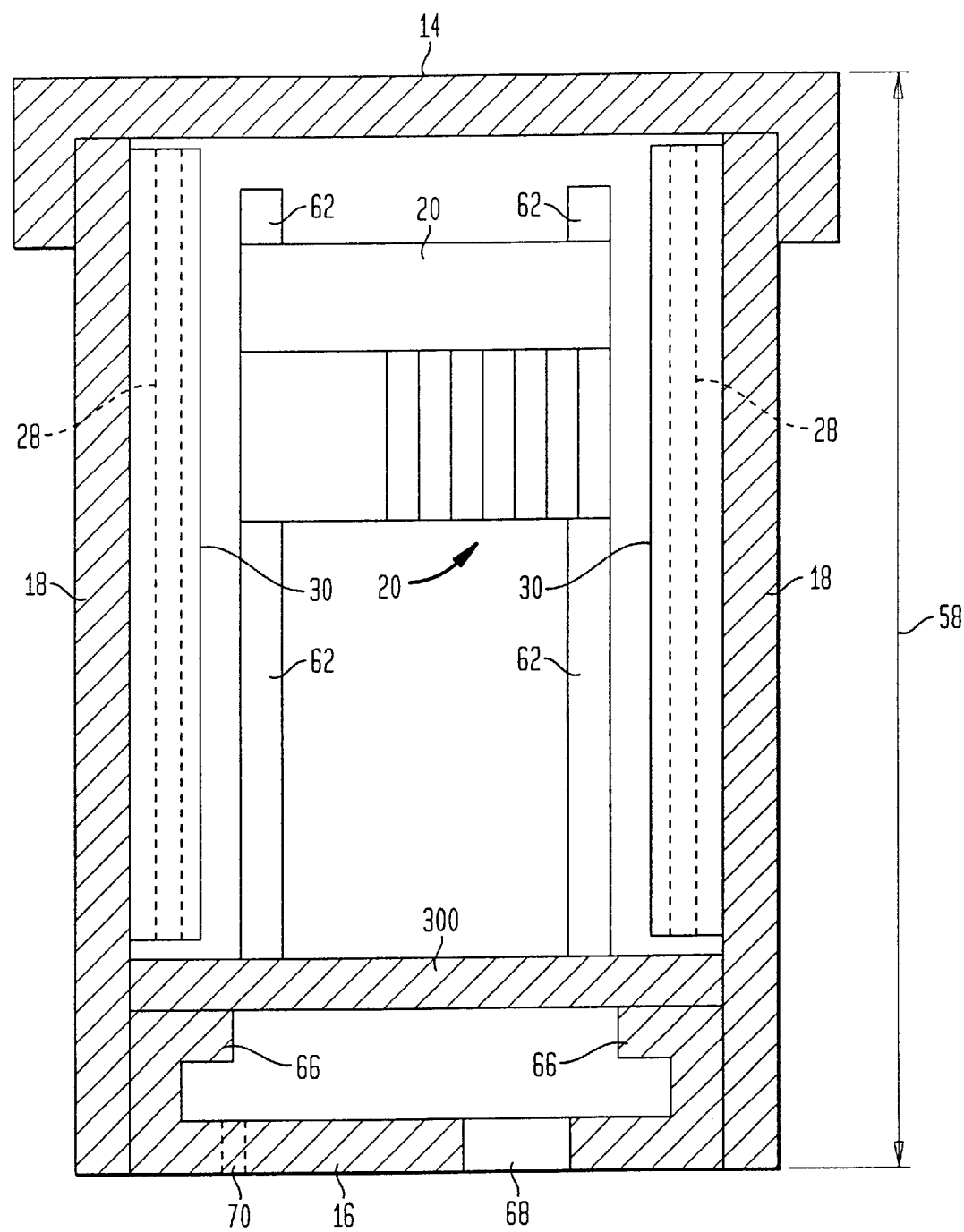
FIG. 3 illustrates a cross-sectional side view of the modular cabinet as viewed along reference line 3—3 of FIG. 1.

As illustrated by FIG. 3, the female tubular members 30 and corresponding male tubular members 28 (indicated by the dashed lines within the female tubular members 30) preferably extend longitudinally along a majority of the height dimension 58 of the modular wall panel such that a continuous interlocking joint is formed at each corner of the modular cabinet 10. However, near a bottom of the cabinet 10, the female tubular member 30 and a corresponding male tubular member 28 may be reduced to a height less than an exterior height of the modular cabinet 10 so as not to interfere with a mounting of the floor member or a bottom panel 16 of the cabinet 10. The generally continuous nature of the interlocking joint advantageously forms a weather-tight seal.

In an alternate embodiment, the male tubular member 28, the female tubular member 30 or both may discontinuously extend over a dimension of a wall such that interlocking only occurs over a fraction of a height of the corner of the modular cabinet 10. In such a case, a seal may be required to seal the corner of the cabinet 10 from the exterior environmental conditions.

FIG. 3 shows the cabinet 10 with the top panel 14 and the bottom panel 16 installed. The cabinet 10 is cut away to better reveal the interaction of the top panel 14 and the bottom panel 16 and to better reveal the electronic equipment 20 mounted on a mounting provision within the interior.

The mounting provision may comprise mounting rails 62, a slidable equipment rack, or other mounting device for mounting electronics equipment 20. In one example, the mounting provision may comprise a slidable rack formed by mounting rails and rollers as is known to those of ordinary skill in the art. Nineteen inch mounting racks are fairly commonly used in the telecommunications field in the United States, whereas twenty-three inch racks are popular in other countries.

As shown in FIG. 3, the bottom panel 16 of the cabinet 10 may include openings 68 for coaxial cable, conduit, or other ingress/egress requirements. The bottom panel 16 preferably includes a flange 66 for providing a mounting surface for an interior floor 64. The bottom panel 16 of the cabinet 10 may include mounting holes 70 for receiving fasteners to secure the cabinet 10 to a foundation or another structure.

Figure 4:
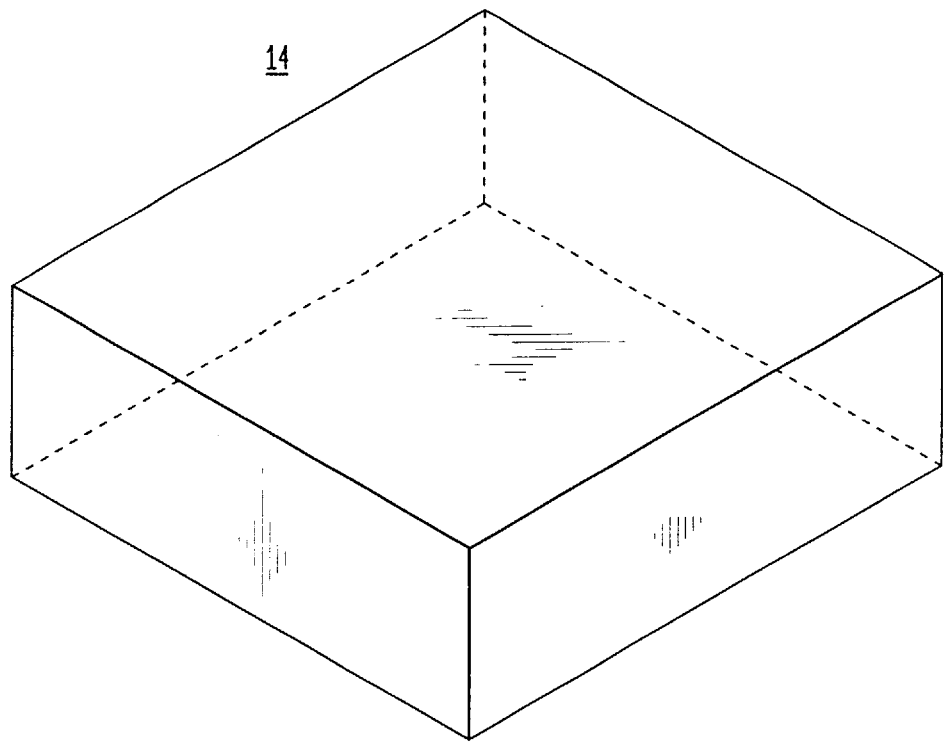
FIG. 4 is a perspective view of a top panel of the modular cabinet in accordance with the invention.

FIG. 4 shows a top panel 14 of the cabinet 10. The top panel 14 is a rectangular structure or a generally polyhedral structure with one open side. The open side preferably slips over exterior surfaces 36 of the four modular wall panels 18 near or at a top of the four modular wall panels 18. The top panel 14 slips over the exterior surface 36 of the four modular wall panels 18 in such a manner that rain or water striking the surface of the top panel 14 is prevented from entering the cabinet interior 19. The top panel 14 may be secured to the cabinet 10 by fasteners from the inside such as rivets, stainless steel bolts, sheet metal screws, or the like.

Figure 5:
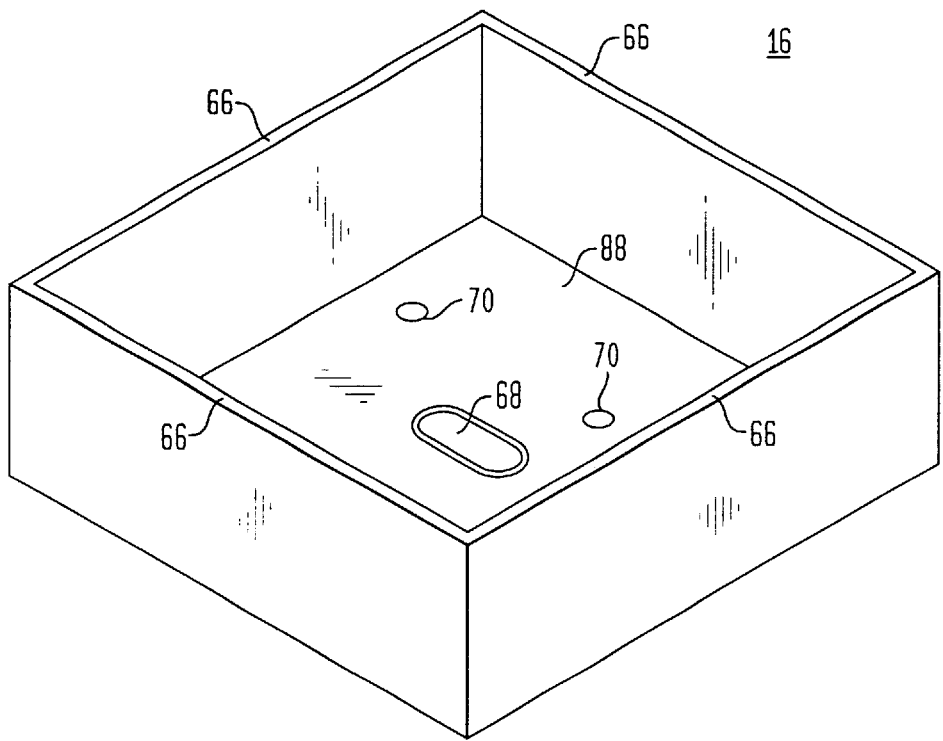
FIG. 5 is a perspective view of a bottom panel of the modular cabinet in accordance with the invention.

FIG. 5 shows a bottom panel 16 of the cabinet 10. Like reference numbers indicate like elements in FIG. 3 and FIG. 5. The bottom panel 16 generally has a similar construction to the top panel 14 except the bottom panel 16 is a generally polyhedral structure with an open side 88 or missing side. The bottom panel 16 slips into the inside of the cabinet 10. The bottom panel 16 contacts the interior surfaces 34 of the cabinet 10 to provide a barrier to water running down the sides of the cabinet 10. The bottom panel 16 may be secured to the cabinet 10 by fasteners from the inside such as rivets, stainless steel bolts, sheet metal screws, or the like.

Figure 6:
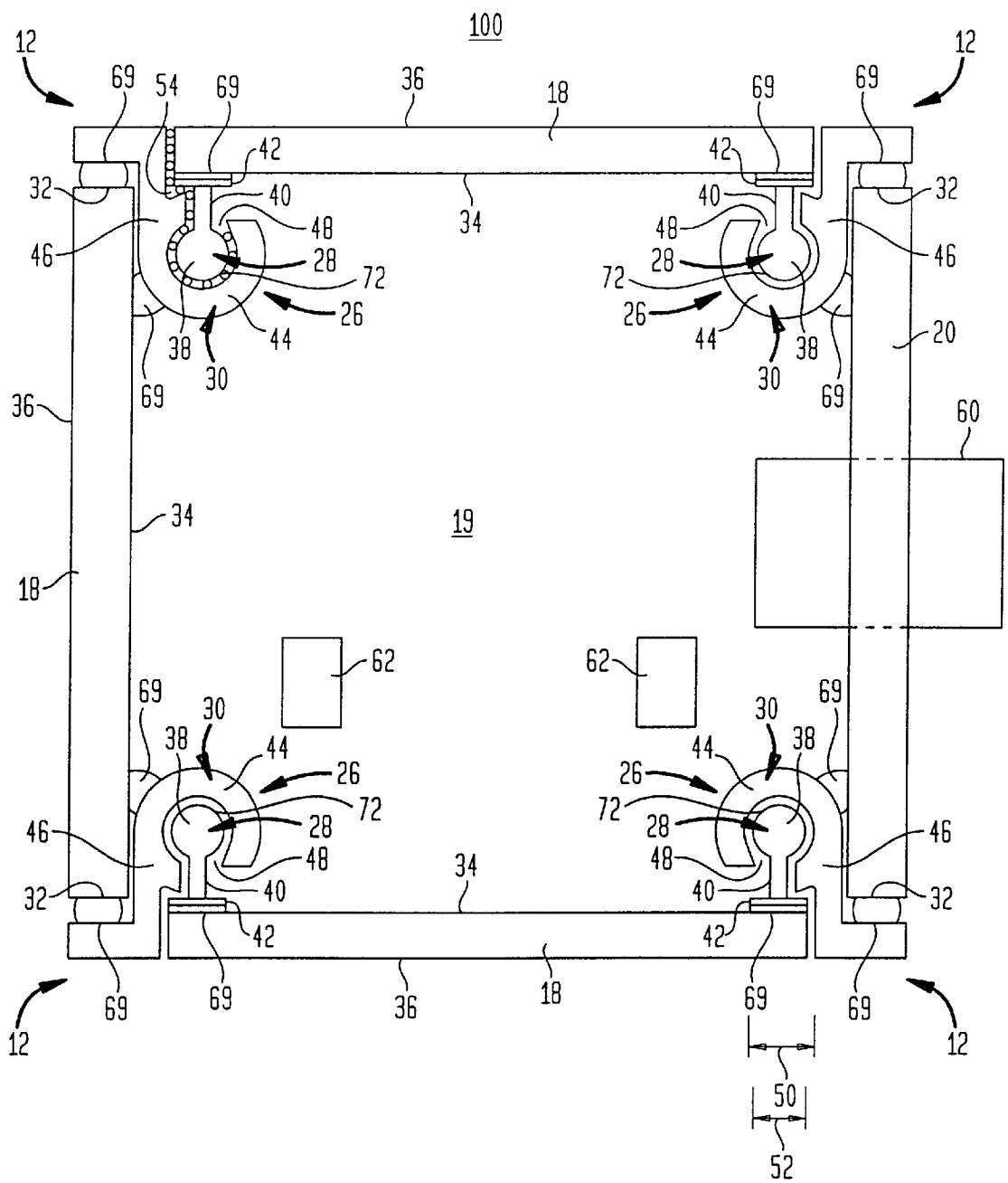
FIG. 6 illustrates a top view of an alternate embodiment of a modular cabinet including a climate control device in accordance with the invention.

FIG. 6 illustrates an alternate embodiment of a modular cabinet 100. The modular cabinet 100 shown in FIG. 6 includes a climate control device 60. The modular cabinet 100 of FIG. 6 is similar to the modular cabinet 10 of FIG. 2 except that one wall panel 20 is adapted to receive a climate control device 60. In one embodiment, the climate control device 60 is mounted through an opening (e.g., a rectangular opening) in the wall panel 20. Like reference numbers in FIG. 2 and FIG. 6 indicate like elements.

A climate control device 60 may comprise an air-conditioner, a heater, or a heat-pump controlled by a thermostat to maintain a preferential temperature for the electronics equipment 20 in the interior 19 of the cabinet 100, despite temperature or climatic conditions around an exterior of the cabinet 100. The wall panel 20 includes mounting structure for mounting for a climate control device 60, such as an air-conditioner. The air-conditioner unit may comprise a self-contained wall mountable refrigeration unit that is mounted in a generally rectangular opening in the modular wall panel 20. The mounting structure preferably includes wall-mountable brackets or other mounting hardware for amply supporting the air conditioner unit. For example, the wall-mountable brackets may comprise a mounting shelf or a substantially orthogonal metallic bracket. One portion of the wall-mountable brackets is secured to the wall panel 20 and another portion is mechanically connected to the climate control device 60 to support the climate control device 60 in the opening.

FIG. 6 illustrates that the circuitous path 54 may be bolstered in environmental integrity by adding silicone sealant or another elastomeric sealant 72. The elastomeric sealant 72 may be selected to permit disassembly of the cabinet into the modular wall sections for relocating or moving of the modular cabinet.

The modular cabinet provides improved maneuverability compared to preassembled cabinets that can not fit through openings or in tight spaces required by telecommunications service providers. The disassembled cabinet may reduce shipping costs and storage costs due to its compact storage form as generally planar panels. Further, the disassembled cabinet may also be shipped in smaller containers and a greater number of shipments of lesser weight to reduce shipping costs.

The interlocking joint allows for a quick assembly in the field without tools. The structural shape of the interlocking joint inherently provides an environmental barrier by the circuitous path formed between the male tubular member and the female tubular member. The circuitous path of the cabinet readily protects the equipment rack for electronics equipment from harsh outdoor environments for shielding rain, dust, radio frequency signals from metallic cabinets. An optional heating, ventilation, and air-conditioning system can maintain a preferential or ideal operating temperature for the electronics equipment.

The cabinet may allow significant savings of installation costs and reductions in time by overcoming various obstacles, including inaccessibility to the installation site for certain larger or heavier cabinets. The fully assembled empty cabinet in accordance with the invention may weigh in excess of 500 pounds depending upon the dimensions of the cabinet. Once electronic components are added, the weight of the cabinet may considerably exceed 500 pounds. Each piece of the modular cabinet of metallic construction preferably weighs less than 75 pounds. For example, each modular wall panel preferably weights less than 75 pounds to allow a single man to readily carry the modular wall panel. Therefore, technicians and workers may readily maneuver the modular planar cabinet walls into position without physical injury or strenuous exertion.

The specification describes various illustrative embodiments of the invention. The scope of the claims is intended to cover various modifications and equivalent arrangements of the illustrative embodiments disclosed in the specification. Therefore, the following claims should be accorded reasonably broadest interpretation to cover modifications, equivalent structures and features which are consistent with the spirit and scope of the invention disclosed herein.

The following is claimed:

1. A cabinet assembly comprising:
    a first set of modular walls having first edges;
    a second set of modular walls having second edges adjacent to the first edges;
    a male tubular member associated with at least one of the first edges;
    a female tubular member for interlocking with the male tubular member, the female tubular member associated with at least one of the second edges; and
    a circuitous gap between the male tubular member and the corresponding female tubular member.

2. The cabinet assembly according to claim 1, wherein the male tubular member and the corresponding female tubular member form an interlocking joint extending over a majority of a height of a vertically extending corner between adjacent modular walls.

3. The cabinet assembly according to claim 1, wherein the male tubular member includes a base portion attached to an interior surface of one of the first set of modular walls and a stem portion raising a cylindrical portion away from the interior surface.

4. The cabinet assembly according to claim 1, wherein the female tubular member comprises a generally hollow cylindrical portion with a longitudinal gap for receiving the corresponding male tubular member.

5. The cabinet assembly according to claim 1, wherein the male tubular member has an exterior diameter corresponding to an interior diameter of a female tubular member to provide the circuitous gap.

6. The cabinet assembly according to claim 5 wherein the circuitous gap is filled with an elastomeric sealant to environmentally isolate an interior of the cabinet from an exterior of the cabinet.

7. The cabinet assembly according to claim 1, further comprising a top panel for mating with the modular walls, a bottom panel for mating with the modular walls, and a mounting provision in the interior of the cabinet for mounting electrical equipment.

8. The cabinet assembly according to claim 1, further comprising a climate control device mounted in one of said modular walls.

9. The cabinet assembly according to claim 1, wherein the male tubular member and the female tubular member are composed of a material selected from the group consisting of a plastic, a polymer, a plastic composite, and a polymer composite.

10. The cabinet assembly according to claim 1, wherein the male tubular member and the female tubular member are adhesively bonded to the modular walls.

11. The cabinet assembly of claim 1, wherein the circuitous gap provides an environmental seal between an interior of the cabinet and an exterior of the cabinet.

12. A cabinet assembly comprising:
    a first set of modular walls having first edges;
    a second set of modular walls having second edges adjacent to the first edges;
    a male tubular member associated with at least one of the first edges; and
    a female tubular member for interlocking with the male tubular member, the female tubular member associated with at least one of the second edges,
    wherein the male tubular member and the corresponding female tubular member form an interlocking joint discontinuously extending over a fraction of a height of a vertically extending corner between adjacent modular walls.

13. A modular cabinet assembly comprising:
- a first set of first modular walls having edges and facing each other;
- a second set of second modular walls having edges and facing each other;
- a plurality of female tubular members attached to the edges of the first modular walls;
- a plurality of male tubular members attached to the edges of the second modular walls;
- corners formed by joining the first set of modular walls and the second set of modular walls into a unitary body; and
- a circuitous gap between each male tubular member and the corresponding female tubular member.

14. The cabinet assembly according to claim 13, wherein the male tubular members and the corresponding female tubular members are united to form interlocking joints extending over a majority of a height of vertically extending corners between adjacent modular walls.

15. The cabinet assembly according to claim 13, wherein each male tubular member includes a cylindrical portion for mating with a corresponding female tubular portion, a base portion attached to an interior surface of one of the first set of modular walls, and a stem portion raising the cylindrical portion away from the interior surface.

16. The cabinet assembly according to claim 13, wherein each female tubular member comprises a generally hollow cylindrical portion with a longitudinal gap of appropriate size and shape to permit a corresponding male tubular member to pass through the longitudinal gap during assembly of the first set and the second set of modular walls.

17. The cabinet assembly according to claim 13, wherein each male tubular member has an exterior diameter generally corresponding to an interior diameter of a female tubular member to provide the circuitous gap.

18. The cabinet assembly according to claim 17 wherein the circuitous gap is filled with an elastomeric sealant to environmentally isolate an interior of the cabinet from an exterior of the cabinet.

19. The cabinet assembly of claim 13, wherein the circuitous gap provides an environmental seal between the interior of the cabinet and an exterior of the cabinet.

20. A modular cabinet assembly comprising:
- a first set of first modular walls having edges and facing each other;
- a second set of second modular walls having edges and facing each other;
- a plurality of female tubular members attached to the edges of the first modular walls;
- a plurality of male tubular members attached to the edges of the second modular walls; and
- corners formed by joining the first set of modular walls and the second set of modular walls into a unitary body,
- wherein the male tubular members and the corresponding female tubular members are united to form interlocking joints discontinuously extending over a fraction of a height of vertically extending corners between adjacent modular walls.

* * * * *